United States Patent [19]
Wright

[11] Patent Number: 5,374,908
[45] Date of Patent: Dec. 20, 1994

[54] SURFACE ACOUSTIC WAVE DEVICE FOR GENERATING AN OUTPUT SIGNAL WITH ONLY A SYMMETRIC OR ONLY AN ASYMMETRIC VIBRATION MODE ACOUSTIC WAVE

[75] Inventor: Peter Wright, Dallas, Tex.

[73] Assignee: RF Monolithics, Inc., Dallas, Tex.

[21] Appl. No.: 982,190

[22] Filed: Nov. 25, 1992

[51] Int. Cl.$^5$ .............................................. H03H 9/64
[52] U.S. Cl. ................... 333/195; 310/313 D
[58] Field of Search ............... 333/193, 194, 195, 196; 310/313 R, 313 B, 313 C, 313 D

[56] References Cited

U.S. PATENT DOCUMENTS

| | | |
|---|---|---|
| Re. 33,957 | 6/1992 | Nakazawa et al. |
| 3,886,504 | 5/1975 | Hartmann et al. |
| 4,013,983 | 3/1977 | Hartemann . |
| 4,060,777 | 11/1977 | Tiersten et al. |
| 4,144,507 | 3/1979 | Shreve . |
| 4,178,571 | 12/1979 | Mitchell . |
| 4,237,433 | 12/1980 | Tanski . |
| 4,387,355 | 6/1983 | Uno et al. |
| 4,425,554 | 1/1984 | Morishita et al. ............... 333/195 |
| 4,454,488 | 6/1984 | Hartmann . |
| 4,494,031 | 1/1985 | Barnes et al. ............... 310/313 B |
| 4,542,356 | 9/1985 | Nakagawa et al. |
| 4,635,009 | 1/1987 | Ebata . |
| 5,115,216 | 5/1992 | Hikita et al. ............... 333/195 |

FOREIGN PATENT DOCUMENTS

| | | |
|---|---|---|
| 100503 | 12/1990 | European Pat. Off. |
| 1-54805 | 3/1989 | Japan . |
| 3119816 | 6/1991 | Japan . |

OTHER PUBLICATIONS

Tanaka et al., "Narrow Bandpass Filter Using Double-Mode SAW Resonators on Quartz", pp. 286–293, Proceedings of the 38th Annual Frequency Control Symposium 1984.

Staples et al, "Surface Acoustic Wave Resonators on ST-Quartz" 1975 Proceedings of Ultrasonic Symposium pp. 307–310.

Tiersten et al, "Guided Acoustic Surface Wave Filters" pp. 293–294, 1975 Ultrasonics Symposium Proceedings.

Kojima et al, "Split Open Metal Strip Arrays and Their Application to Resonators" 1981 Ultrasonics Symposium.

Uno et al, "Realization of Miniature SAW Resonators Having a High Quality Factor" Japanese Journal of Applied Physics vol. 20 (1981) Supp. 20-3, pp. 85–88.

Tanaka et al, "Narrow Bandpass Filter Using Double-Mode SAW Resonators on Quartz" 38th Annual Frequency Control Symposium 1984 pp. 286–293, 1984.

*Primary Examiner*—Robert J. Pascal
*Assistant Examiner*—Darios Gambino
*Attorney, Agent, or Firm*—Jones, Day, Reavis & Pogue

[57] ABSTRACT

A surface acoustic wave device for generating an output signal with only a symmetric or only an asymmetric vibration acoustic wave mode in a piezoelectric substrate. The device has first and second transversely spaced transducers and the device is driven from both the first and second transducers. A third transducer is between and acoustically coupled to the first two transducers. The electrodes of all three transducers are arranged with respect to each other so as to cause only a symmetrical acoustic vibration mode or only an asymmetrical acoustic vibration mode in the piezoelectric substrate.

6 Claims, 4 Drawing Sheets

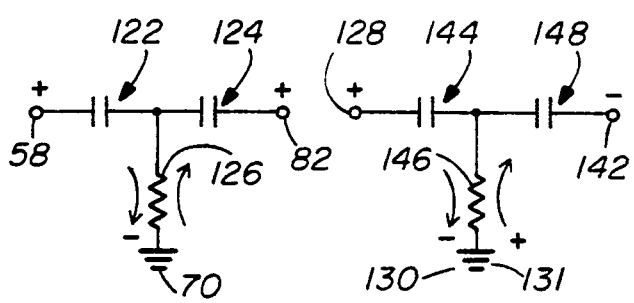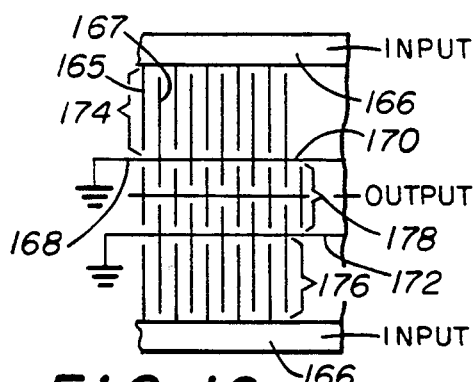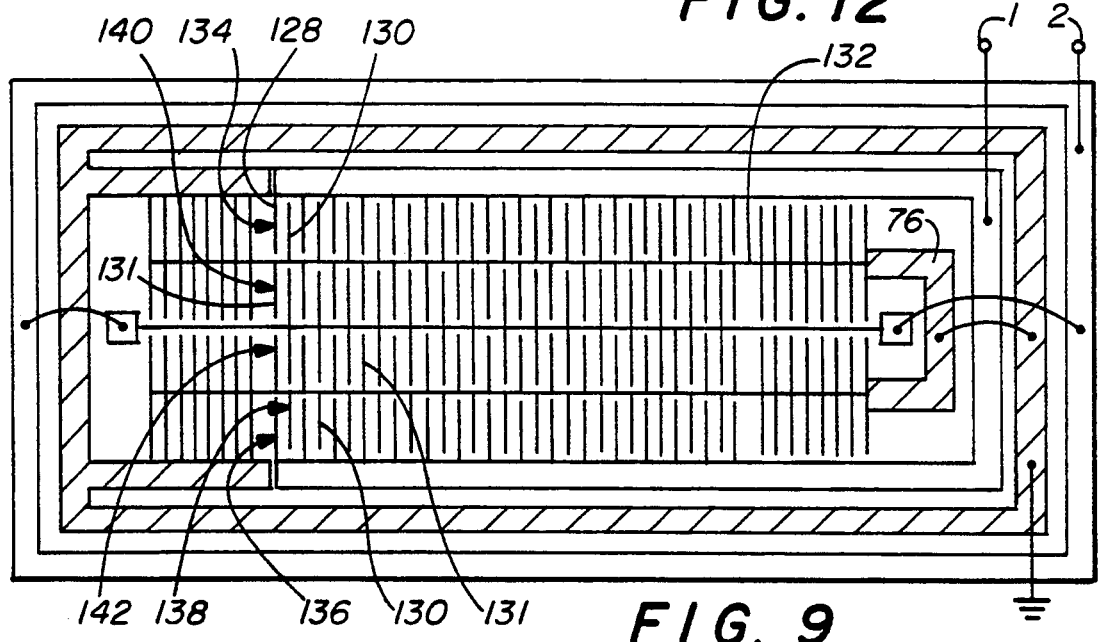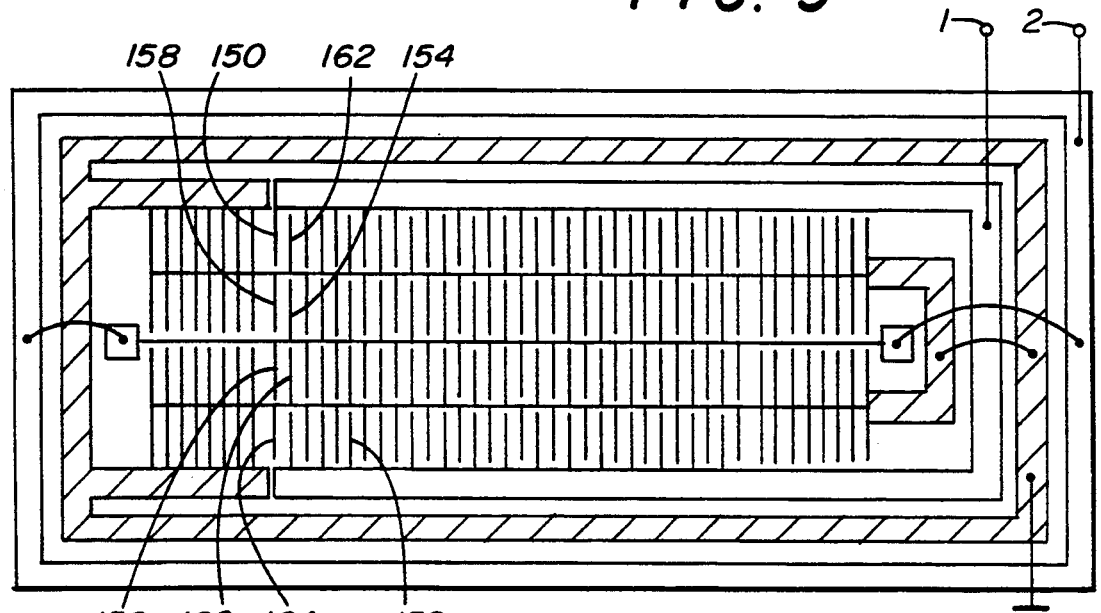

SURFACE ACOUSTIC WAVE DEVICE FOR GENERATING AN OUTPUT SIGNAL WITH ONLY A SYMMETRIC OR ONLY AN ASYMMETRIC VIBRATION MODE ACOUSTIC WAVE

BACKGROUND OF THE INVENTION (1) Field of the Invention

The present invention relates to a surface acoustic wave device that utilizes a plurality of acoustic surface wave guides and periodic arrays of reflectors that receive an input signal and generate an output signal with only a single vibration mode acoustic wave generated in the substrate.

(2) Background of the Related Art

In the 1975 proceedings of the Ultrasonic Symposium, on pages 307-310, Staples et al discussed a bulk-wave resonator with trapped energy modes. This article described the SAW resonator model as consisting of a region of slow wave velocity (the reflectors and transducers) surrounded by regions of faster wave velocity, giving rise to wave guide cut-off phenomena, in other words, energy trapping. The extent to which the waves are trapped and the number of distinct modes trapped depend upon the velocity difference and the width of the trap region. FIG. 3 on page 308 of the Staples et al article illustrates the expanded response of a SAW resonator with shorted reflecting stripes. The spurious modes are indicated by arrows on the high frequency side of the response. These spurious modes are trapped energy modes and are sometimes referred to as inharmonic spectra. To verify that this was the case, resonators were constructed and tested and the results recorded as illustrated in FIG. 4 on page 308 of the Staples et al article in the form of dispersion curves. The dispersion curves are obtained by fitting the transcendental equation (symmetric case) associated with a thin-film wave guide to the obtained data points. The frequency of each mode, including the fundamental, shifts up in frequency as the width of the resonator is decreased. Furthermore, the number of modes present or trapped also decreases until at 10 wavelengths only one symmetric mode remained.

At the same 1975 proceedings of the Ultrasonic Symposium, Tiersten et al in an article entitled "Guided Acoustic Surface Wave Filters", pages 293-4, discussed a number of filter structures utilizing acoustic surface wave guides and periodic arrays reflecting strips to form multimoded resonant configurations. This article indicated that the devices described are analogous to the monolithic crystal filter in that an array of acoustically coupled resonators is obtained from a structure placed on a single substrate. The coupling between resonators is described in the article in terms trapped energy modes of the surface wave guiding structures. This article points out that if two interdigital transducers are placed in parallel on a piezoelectric substrate, between two arrays of reflecting strips, as shown in FIG. 1 on page 294 of the article, and both the reflecting arrays and the interdigital transducers are partially encased in two thin strips of a "slow" insulating material deposited on the surface of the piezoelectric substrate, a two-pole bandpass filter is created with a bandwidth controllable by the spacing between the electrodes in the reflecting array, the width of the overlapping portion of the electrodes in each of the transducer structures, the thickness of each identical strip and the spacing between the strips which act as thin-film wave guides. This article points out that in operation, the driving transducer excites, at the driving frequency, both the fundamental symmetric and asymmetric modes with respect to the center line of the structure to about the same amplitude. Since, at the driving frequency, the wavelength of each mode differs, and since both modes are reflected by arrays with the same spacing, the reflection of each mode will have different frequency characteristics. Consequently, the detecting circuit, which responds to the sum of the two modes, will experience a response as shown in FIG. 3 on page 294 where the magnitude of the passband ripple is determined by the resistances in the external circuitry. The structures described are in fact coupled resonator structures and may be thought of as surface wave analogs of the widely used bulk-wave monolithic crystal filter. As stated in the article, as in the case of other bandpass devices such as the monolithic crystal filter, these structures may be used not only as complete monolithic bandpass filters and as bandpass filter sections wherein two or more structures are connected in tandem to form higher order filters but also in various other ways, including several types of frequency discriminators or demodulators and band-reject filters.

Tiersten et al then obtained U.S. Pat. No. 4,060,777 dated Nov. 29, 1977 disclosing the resonator and resonator-type wave filter formed by a piezoelectric body on which acoustic surface waves are guided and reflected and in which mode coupling in a direction transverse to the surface wave propagation is utilized. This patent discloses a surface wave device formed on a piezoelectric body in which the transverse mode structure of the device is controlled by controlling the mass loading of reflector and transducer elements of the structure. At the resonant frequency of the device, a standing wave is trapped or largely confined in the transverse direction by the wave-guiding action of the reflectors and the transducer. Each of the electrode fingers of the transducer has a particular length and is placed so as to have a maximum interaction with the standing wave. If the trapping in the transverse direction is excessive, more than one resonance may exist. The resonance lowest in frequency is the fundamental symmetric mode. The next higher mode is the fundamental asymmetric mode. Successively higher modes are alternately symmetric and asymmetric with respect to the longitudinal center line of the resonator structure. The resonance curve of a resonator having excessive trapping in the transverse direction is shown in FIG. 2A of U.S. Pat. No. 4,060,777 which is incorporated herein by reference in its entirety. The shape of the fundamental symmetric mode of the standing wave in the transverse direction is shown in FIG. 3A of U.S. Pat. No. 4,060,777. By properly dimensioning the resonator, the number of transverse modes which are trapped and their frequency spacing may be controlled by controlling the width of the electrode fingers and/or the thickness and/or the mass of the reflecting strips. By suitable choice of material it is possible to trap only the fundamental symmetric transverse mode of the fundamental symmetric and asymmetric transverse modes.

FIG. 4 of U.S. Pat. No. 4,060,777 shows a filter structure wherein two interdigital transducers are placed on a piezoelectric substrate between two arrays of reflecting strips. A source of energy is connected to one transducer which is the input of the device and a load is connected to the other transducer which is the device output. By properly selecting the width of the reflectors and/or the thickness and/or mass of the reflecting strips, both the symmetric and the asymmetric fundamental transverse modes may be excited.

In U.S. Pat. No. Re. 33,957 issued Jun. 9, 1992, a high-frequency narrow bandpass multimode filter is constructed with resonators closely disposed transversely to each other on the single piezoelectric substrate to generate different vibration modes of different resonant frequencies. As set forth in that patent, when two SAW resonators are transversely disposed on a piezoelectric substrate in a parallel and closely opposed relation and when the resonators are excited, the resultant SAWs are acoustically coupled to each other and the resonators generate two vibration modes, that is, the symmetrical mode and the asymmetrical mode.

In these prior art devices, for a given bandwidth of the device there is low coupling and a high impedance. When the beamwidth of the device increases, the bandwidth decreases and the coupling increases. When the beamwidth decreases, the bandwidth increases and the coupling decreases. Thus, a significant disadvantage exists with the prior art. For a given bandwidth, if one wishes to increase the coupling, the track width, or beamwidth, must be increased. However, when the track width is increased, the bandwidth decreases.

SUMMARY OF THE INVENTION

The present invention overcomes the disadvantages of the prior art by providing a surface acoustic wave device formed of transversely spaced resonators on a piezoelectric substrate which, for a given beamwidth, has an increased pole separation of the frequency response curve that is three-to-four times the pole separation of the frequency response curve of the prior art devices for the same beamwidth. This means that if, for a given bandwidth of the prior art, the present invention is used, the beamwidth can be increased to bring the pole separation back to that of the prior art while increasing the coupling which decreases the impedance and increases the Q of the device.

Further, the present invention will function with any type of acoustic wave, either surface or bulk, so long as it has an electrical potential propagating along the surface. This includes surface acoustic wave devices, surface-skimming bulk-wave devices, leaky surface acoustic wave devices and surface transverse wave devices, for example only. Again, the crucial element is that the acoustic wave device has an electrical potential that propagates along the surface. Further, various piezoelectric materials can be utilized although, quartz is the preferred embodiment for narrow bandwidth devices.

In the present invention, first and second longitudinally-extending surface acoustic wave transducers are spaced transversely on each side of the longitudinal center line of a piezoelectric substrate. The transducers have first and second sets of transversely-extending interdigitated electrode fingers in overlapped relationship. A third longitudinally-extending SAW transducer is formed on the piezoelectric substrate by a third set of transversely-extending electrode fingers in between and in overlapping interdigitated relationship with the second set of transversely extending electrode fingers of each of the first and second transducers. A common input signal line is connected to the first set of electrode fingers of each of the first and second transducers. A common output signal line is coupled to each of the third set of electrode fingers such that an input signal applied to the common input signal line causes only a single vibration mode in the substrate to generate an output signal. Such a device, including the first, second and third transducers, forms a high-frequency bandpass filter. The amount of overlap of each first set of electrode fingers with the second set of electrode fingers in the first and second transducers forms the beamwidth of the device. The bandpass of the device may be adjusted by varying the beamwidth of the device.

Thus, it is an important feature of the present invention to provide a surface acoustic wave device for generating an output signal with only symmetric or asymmetric acoustic modes.

It is another important feature of the present invention to provide a bandpass filter formed by a surface acoustic wave device that has greater coupling and lower impedance for a given bandwidth than the prior art devices.

It is still another feature of the present invention to provide a surface acoustic wave bandpass filter which has a greater bandwidth adjustment than the prior art devices for a given frequency while maintaining a higher coupling and lower impedance.

It is yet another feature of the present invention to provide a bandpass filter that selectively generates an output signal with only symmetric vibration acoustic wave modes in the piezoelectric substrate.

It is also a feature of the present invention to provide a surface acoustic wave device that selectively generates an output signal with only asymmetric vibration acoustic wave modes in the piezoelectric substrate.

It is another feature of the present invention to provide a surface acoustic wave device for operating in a selected mode, either symmetric or asymmetric, wherein the parasitic loss generated by resistance in the bus bar may be substantially cancelled.

It is yet another feature of the present invention to provide a surface acoustic wave device for generating an output signal with acoustic vibration modes that are either only symmetric or only asymmetric.

It is also an important feature of the present invention to provide a bandpass filter utilizing a surface acoustic wave device for generating an output signal with only a symmetric or only an asymmetric vibration acoustic wave mode in a piezoelectric substrate.

BRIEF DESCRIPTION OF THE DRAWINGS

These and other features of the present invention will be more fully disclosed when taken in conjunction with the following DETAILED DESCRIPTION OF THE DRAWINGS in which:

FIG. 8 is an equivalent circuit diagram of the device of FIGS. 4 and 6 illustrating how parasitic voltages are developed in the ground bus bar;

FIG. 9 is a plan view of an alternate embodiment of a surface acoustic wave device of the present invention so constructed as to substantially eliminate the parasitic voltage generated on the ground bus bar by the second symmetric mode;

FIG. 10 is an equivalent circuit diagram of the device of FIG. 9 illustrating how the parasitic voltages on the ground bus bar are substantially cancelled;

FIG. 11 is a plan view of a device for generating only asymmetric vibration acoustic wave modes in the substrate and wherein the device is constructed so as to substantially eliminate the parasitic voltages generated on the bus bar by the first asymmetric mode; and FIG. 12 is a partial illustration of the device in FIG. 4 illustrating how the beamwidth of the device can be adjusted to increase the coupling, decrease the bandwidth and increase the Q of the device.

DETAILED DESCRIPTION OF THE DRAWINGS

Figure 1:
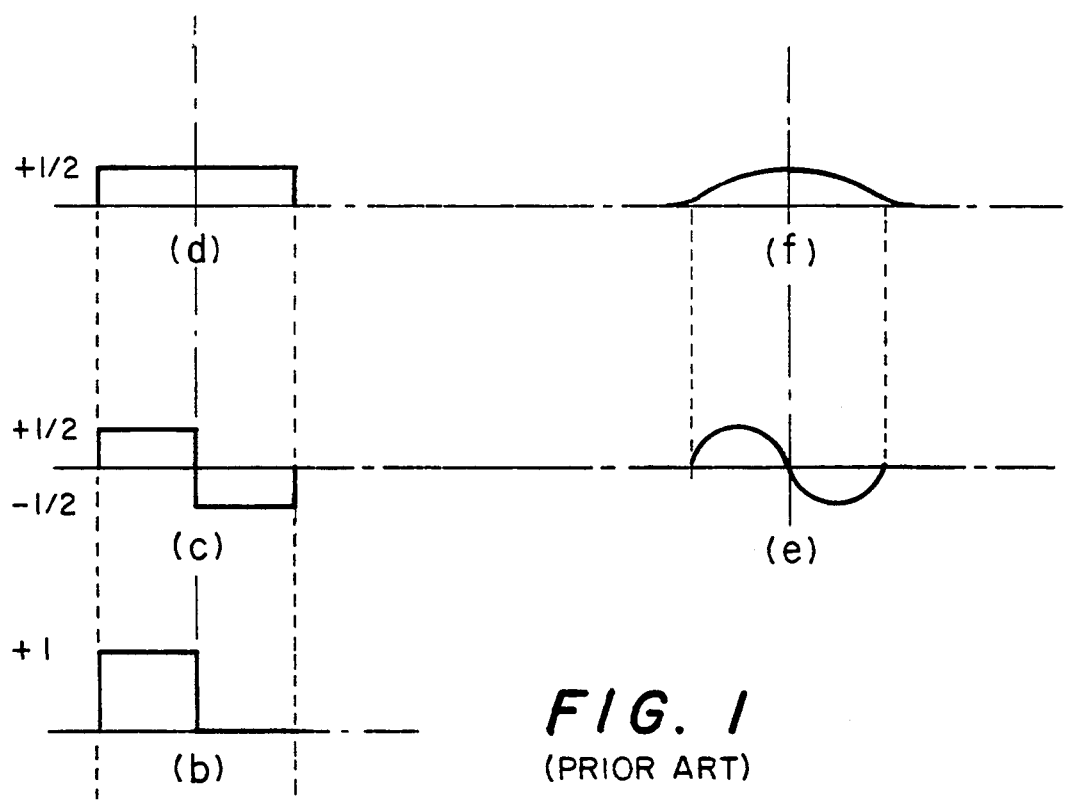
FIG. 1 is a representation of a prior art surface acoustic wave device for generating symmetric and asymmetric mode acoustic waves in the piezoelectric substrate as illustrated by the waveforms associated with the drawing of the device.
Figure 1:
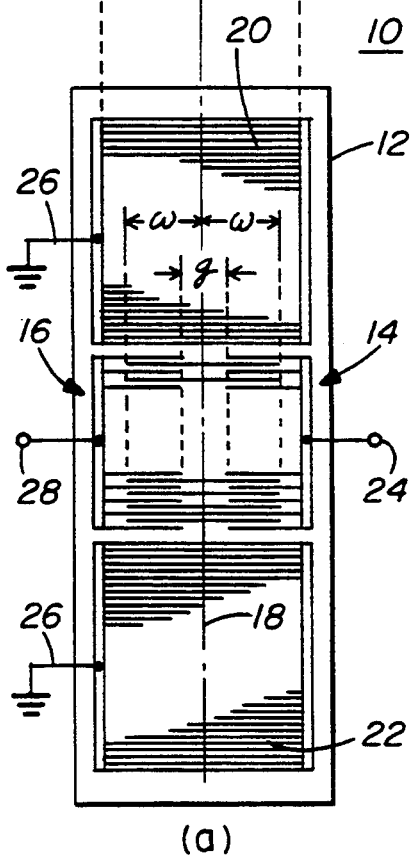

FIG. 1(a) is a plan view of a resonator 10 of the prior art. It has a piezoelectric substrate 12 on which interdigitated electrode finger transducers 14 and 16 are deposited. A common bus bar 18 extends longitudinally along and in the center of substrate 12 and interconnects the electrode fingers of reflectors 20 and 22. An input signal is supplied between input terminal 24 and ground 26 and the output signal is taken from output terminal 28 and ground 26. The transducers 14 and 16 are in a parallel and closely opposed transverse relation with transducer 14 on one side of common bus 18 and transducer 16 on the other side so that when they are excited and the resultant surface acoustic waves acoustically couple the transducers 14 and 16 to each other, the transducers 14 and 16 generate two or more vibration modes as shown in FIGS. 1(c), 1(d), 1(e) and 1(f). Thus, when a voltage is applied to the input transducer 14 as shown in FIG. 1(b), it can be viewed as an asymmetric voltage being applied to the first and second transducers 14 and 16 as illustrated in FIG. 1(c) and a symmetric voltage being applied to both transducers as shown in FIG. 1(d). If the input signal is one unit as illustrated in FIG. 1(b), then the addition of the asymmetric waveform in FIG. 1(c) and the symmetric waveform in FIG. 1(d) will equal the input waveform shown in FIG. 1(b). A more accurate version of acoustic waveforms generated in the piezoelectric substrate are shown in FIGS. 1(e) and 1(f). In FIG. 1(e) the asymmetric waveform is illustrated and in FIG. 1(f) the symmetric waveform that is generated is illustrated. It will be noted in FIG. 1(a) that each of the resonators 14 and 16 has a beamwidth, W, formed by the overlapping electrode fingers. The beamwidth is also the wave guide width of the device. There is also a separation, g, which is the effective gap between the two transverse transducers 14 and 16. The vibration mode depends on the width, W, and the width, W, is one of the factors determining the acoustic coupling intensity between the transducers 14 and 16. Since the distance, g, is a parameter indicative of the proximity of the resonators 14 and 16 with respect to each other, it will be understood that the acoustic coupling intensity also varies with the value of g.

Figure 2:
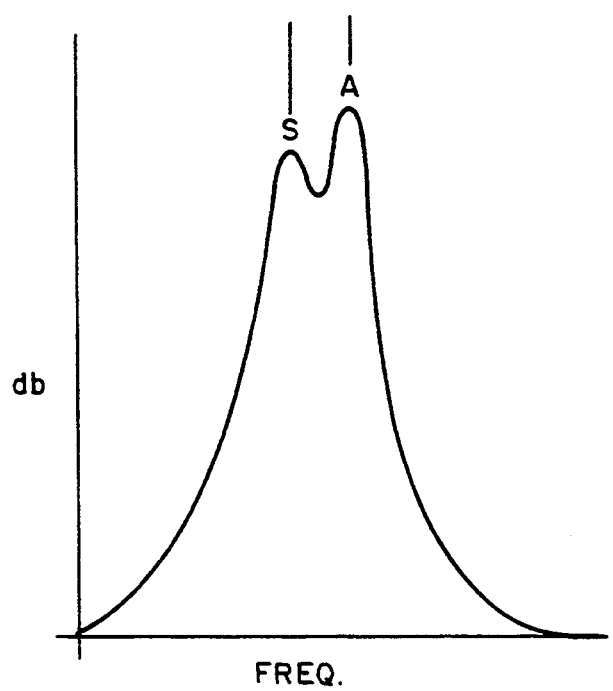
FIG. 2 is a frequency response curve of the output signal of the device of FIG. 1.

The typical output frequency waveform for a device such as shown in FIG. 1(a) is illustrated in FIG. 2. It will be noted that there is a peak, S, that is generated by the symmetric vibration acoustic wave modes and an asymmetric peak, A, generated by the asymmetric vibration acoustic wave modes in the substrate.

Figure 3:
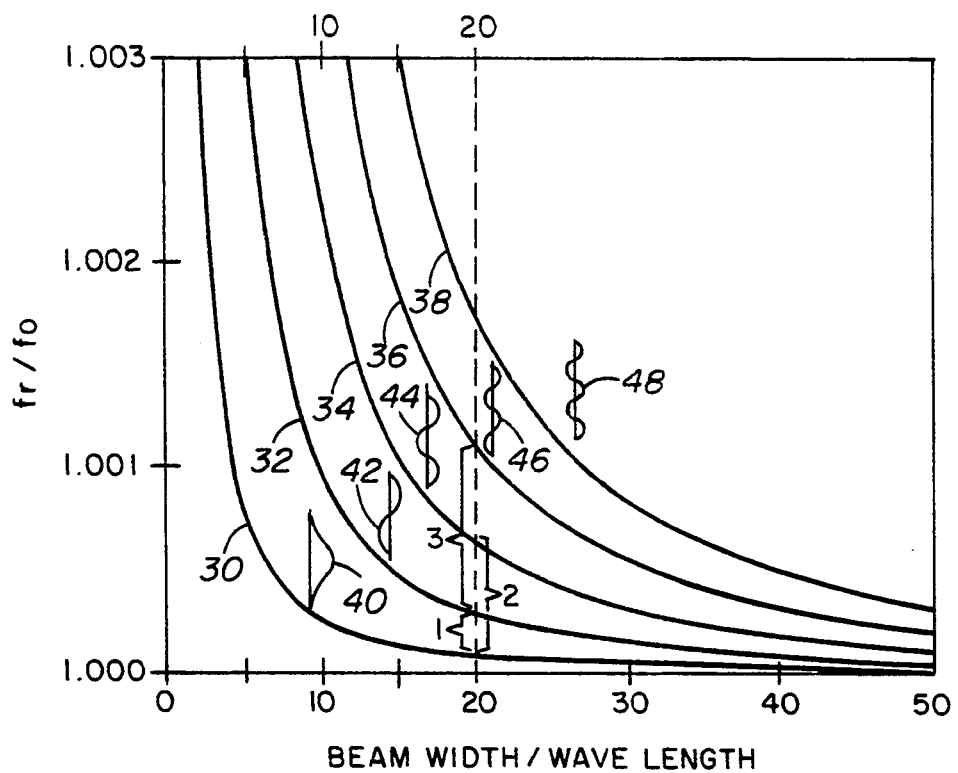
FIG. 3 is a graph of the theoretical dispersion curves of surface acoustic wave resonators illustrating the symmetric and asymmetric vibration modes generated by the acoustic waves in the substrate.

FIG. 3 is a graph illustrating the dispersion curves set forth and explained by Tanaka et al in the article entitled "Narrow Bandpass Filter Using Double-Mode SAW Resonator on Quartz" presented at the 1984 Annual Frequency Control Symposium, pages 286-293 at page 287. This graph sets forth the beamwidth along the abcissa and the normalized resonant frequency along the ordinate axis. It will be noted in this graph that the frequency of each mode, including the fundamental, shifts up in frequency as the width of the transducer is decreased. These theoretical dispersion curves were obtained with the device formed on an ST-cut quartz substrate, with aluminum electrodes having a thickness equal to 0.02 x$\lambda$ where $\lambda$ is the designated frequency and the number of interdigitated electrode pairs, N, equaling 300. Curve 30 is the curve for the fundamental symmetric mode and is illustrated by the waveform 40 in FIG. 3. Curve 32 represents the first asymmetric mode and the waveform generated is illustrated by the curve 42. Curve 34 represents the second symmetric mode and the waveform generated is illustrated by the waveform 44. Curve 36 represents the second asymmetric mode and the waveform generated is represented by the waveform 46. Curve 38 represents the third symmetric mode and the waveform generated is represented by the curve 48.

Thus for a typical prior art SAW device generating the first symmetric and the first asymmetric curves 30 and 32, respectively, the pole, S and A, separation (FIG. 2) at the beamwidth designated by the numeral 20 in FIG. 1(a) is illustrated by the bracket numbered "1". This separation represents separation between the symmetric and asymmetric modes S and A shown in FIG. 2. If the first asymmetric mode illustrated by waveform 42 could be eliminated, then a mode separation between curves 30 and 34 as illustrated by the bracket numbered "2" would be obtained. Note that the mode separation encompassed by the bracket "2" is more than twice that encompassed by the bracket "1". It is approximately 2.6 times larger than the mode separation obtained when both the symmetrical and asymmetrical acoustic waves are present.

Further, if the symmetric modes represented by curves 30 and 34 in FIG. 3 could be eliminated, the separation of the two asymmetric mode curves 32 and 36 as illustrated by the bracket "3" is almost four times larger than that of the separation caused when both the symmetric and asymmetric modes are present as illustrated by bracket "1". This discovery is extremely important in acoustic wave devices, particularly those forming bandpass filters. As is well known in the art, and using FIG. 2 for purposes of explanation, if it is desired to increase the coupling of the prior art device, the beamwidth, W, of the device is increased. However, this decreases the bandpass of the device. Thus, the mode peaks, S and A, in FIG. 2 are brought closer together. On the other hand, if it is desired to increase the bandwidth, the distance between the mode peaks S and A, then the beamwidth, W, of the device must be decreased. However, this decrease of beamwidth, W, decreases the coupling, increases the impedance of the device and decreases the Q of the device. To compensate for these interactions, the prior art devices are modified by controlling the width and/or thickness and/or mass of the reflecting strips and by suitable choice of material and further by the use of external matching devices.

The present invention provides a device that generates only symmetric or only asymmetric modes, as desired, thus giving a much larger bandwidth for a given beamwidth of the device. This means that if the present invention is to be designed to operate with the same bandpass frequency of the prior art device, for a given beamwidth, the bandpass of the present device will be substantially 2.6 to 4 times greater than the prior art device. To obtain the same bandwidth as the prior art device, the beamwidth of the present device can then be increased thus increasing the coupling, decreasing the impedance and increasing the Q of the device when the same bandwidth is achieved.

Figure 4:
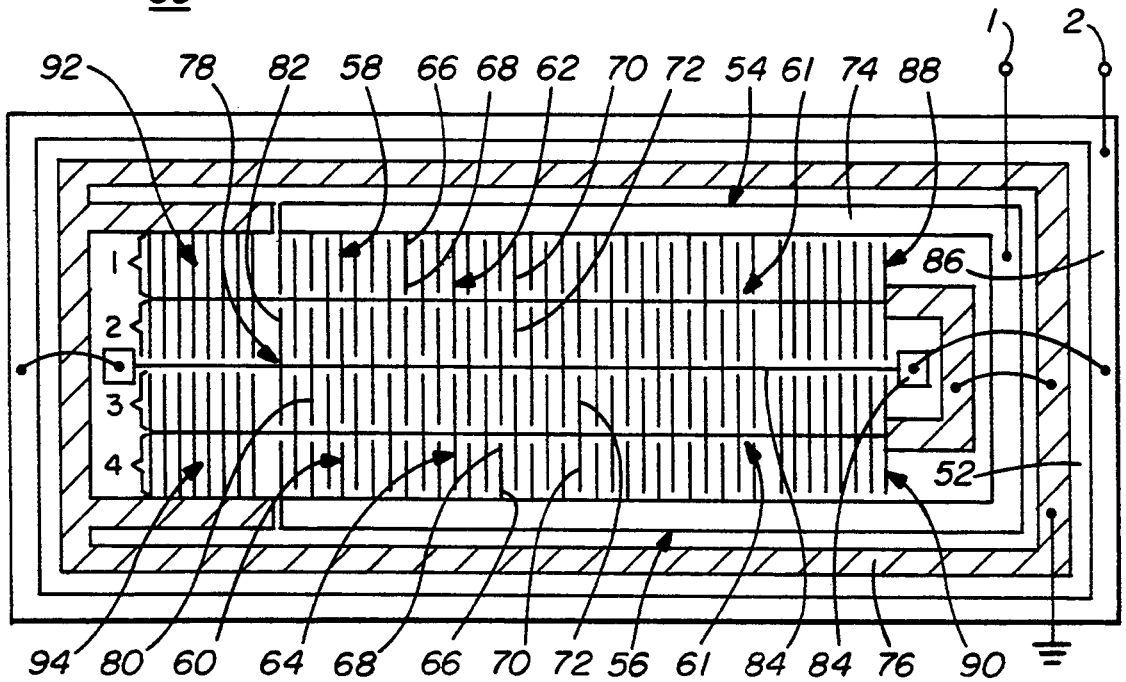
FIG. 4 is a plan view of a surface acoustic wave device of the present invention.

FIG. 4 is a plan view of a novel surface acoustic wave device of the present invention that generates only a symmetric vibration mode acoustic wave that generates the output signal. The device 50 includes a piezoelectric substrate 52, preferably of quartz but which could also be made of other piezoelectric material, on which is deposited a first transducer 54 and a second transducer 56. The transducers 54 and 56 are in spaced relationship to each other on the substrate, one on each side of the central longitudinal axis of the substrate. Each transducer 54 and 56 is formed of a first set of electrodes 58 and 60, respectively, and a second set 61 of interdigitated electrode fingers 62 and 64, respectively. Thus electrode fingers 58 and 62 are interdigitated and electrode fingers 60 and 64 are interdigitated. Each of the electrode fingers 58, 60, 62 and 64 extend transversely to the longitudinal axis of the substrate 52. Each electrode 58 and 60 has an outer end 66 and an inner end 68. Each electrode finger 62 and 64 of the second set 61 of electrode fingers has an outer portion 70 and an inner portion 72. A common input signal bus 74 is connected to the outer ends 66 of each of the first set of electrode fingers 58 and 60 of both of the spaced transducers 54 and 56. A common ground bus 76 interconnects each electrode finger 62 and 64 of the second set 61 of electrode fingers of both the first and second transducers 54 and 56. The ground bus interconnection 76 occurs between the inner and outer ends 70 and 72 of each electrode finger 62 of the second set of electrode fingers.

A third set of electrode fingers 78 having first and second outer ends 80 and 82 is interdigitated with its adjacent transducer electrodes. Thus outer end 82 of the third set of electrode fingers 78 is interdigitated with the inner ends 72 of the second set of electrodes 61 of the first transducer 54 and the outer ends 80 of the third set of electrodes 78 are interdigitated with the inner ends 72 of the second set 61 of electrodes 62 for the second transducer 56. Thus, the interdigitation of the third set of electrodes 78 with the second set 61 of electrodes 62 of the first transducer 54 and electrodes 64 of the second transducer 56 forms the third transducer 78. A common output signal bus 84 along the central longitudinal axis of the substrate 52 interconnects the third set of electrode fingers 78 between the first and second outer ends 80 and 82 thereof and is further coupled to an outer bus 86 where the output signal is taken off of terminal 2 shown thereon. The input signal is applied to terminal 1 between terminal 1 and ground bus 76 and the output signal is taken between terminal 2 and ground bus 76.

Reflector gratings 88 and 92 are formed on the outer ends of transducer 54 and reflector gratings 90 and 94 are formed on the outer ends of second transducer 56. When an input signal is applied to input terminal 1 and ground bus 76, only symmetric vibration modes are executed in the substrate to generate the output signal between terminal 2 and ground bus 76. These symmetric vibration modes can be illustrated by a graph as in FIG. 5 as related to the four tracks of the device shown in FIG. 4. The first track, 1, in FIG. 4 is formed by the interdigitated electrodes 58 and 70 of the first and second set of electrodes. The second track, 2, is formed by the interdigitated electrodes 72 of the second set of electrodes and electrodes 82 of the third set of electrodes. The third track, 3, is formed by the interdigitated electrodes 80 of the third set of electrodes and the inner end 72 of the second set of electrodes for the second transducer 56. The fourth track, 4, is formed by the interdigitated electrodes 70, the outer end of the second set of electrodes for the second transducer 56 and electrodes 60, the first set of electrodes for transducer 56.

Figure 5:
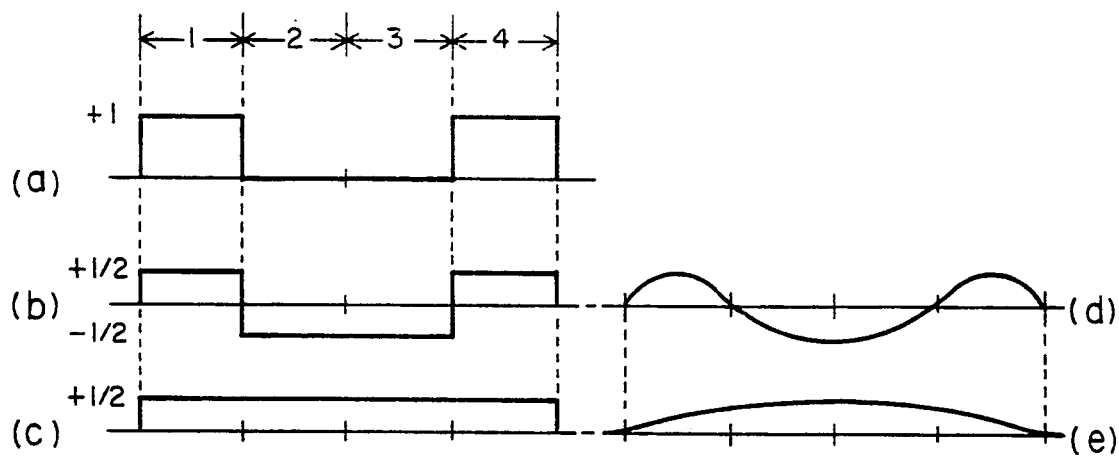
FIG. 5 is a set of waveforms demonstrating that only symmetric vibration acoustic wave modes are generated in the device of FIG. 4.

Referring now to FIG. 5, when an input signal is applied to tracks 1 and 4 as illustrated in FIG. 5(a), the equivalent excitation voltages applied are illustrated in FIGS. 5(b) and 5(c). Note that when the equivalent voltages in FIGS. 5(b) and 5(c) are added together, they reproduce the waveform shown in FIG. 5(a). It will be noted in FIGS. 5(d) and 5(e) that the acoustic waveforms caused to be generated in the substrate are both symmetrical waveforms. No asymmetrical acoustic waves are excited. Thus waveforms 32 and 36 in FIG. 3 are eliminated. The first symmetrical waveform, FIG. 5(e), corresponds to curve 30 in FIG. 3. The second symmetrical waveform shown in FIG. 5(d) corresponds to the waveform 44 and curve 34 in FIG. 3. Thus, the bandwidth of the device in FIG. 4 for a given device beamwidth is illustrated by the vertical distance covered by the bracket "2" in FIG. 3. As stated earlier, this distance is substantially 2.6 times larger than that which is normally obtained in the prior art. Thus the device in FIG. 4 generates an output signal that has a bandwidth substantially 2.6 times larger than that generated in the prior art for the same beamwidth. As explained earlier, that bandwidth can be reduced to a corresponding bandwidth obtained in the prior art while the coupling is being increased, as will be shown hereafter so as to reduce the bandwidth to the prior art bandwidth while having greater coupling, lower impedance and a higher Q, all desirable characteristics in one of these devices.

Figure 6:
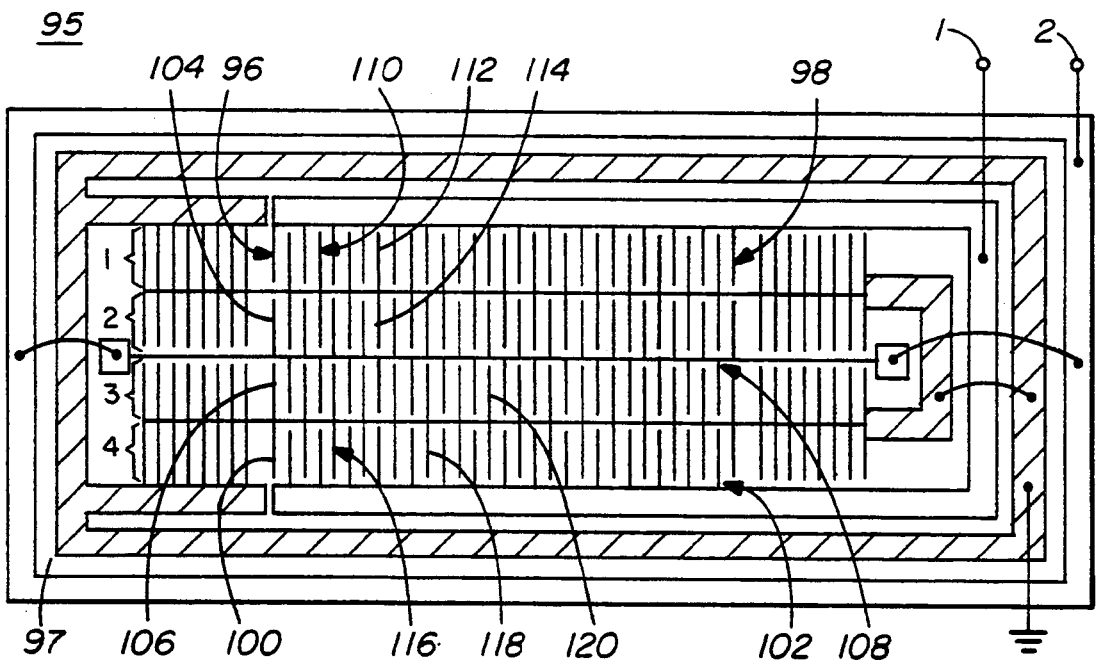
FIG. 6 is a plan view of an alternate embodiment of the present invention in which the surface acoustic wave device generates an output signal with only asymmetric vibration acoustic wave modes generated in the piezoelectric substrate.

The device 95 with the structure shown in FIG. 6 generates only asymmetric vibration acoustic wave modes. Notice in FIG. 6 that the first set of electrodes 96 of the first transducer 98 are positioned longitudinally on the substrate 180° electrically out-of-phase with the first set of transversely-extending electrode fingers 100 of the second transducer 102. This arrangement differs from that in FIG. 4 where the first set of transversely-extending electrode fingers 58 is in axial alignment with the first set of transversely-extending electrode fingers 60 of the second transducer 56. Further, in FIG. 6, the first and second outer ends 104 and 106 of the third set of electrodes 108 are alternately positioned longitudinally on the substrate 180° electrically out-of-phase with each other. Thus, the first set of electrode fingers 96 in the first one of the spaced parallel transducers 98 is in spaced axial alignment with corresponding ones of the second set of electrode fingers 116 of the second one of the spaced parallel transducers 102. In addition, the electrode fingers 100 in the second one of the spaced parallel transducers 102 is in spaced axial alignment with corresponding ones of the second set of electrode fingers 110 of the first one of the spaced parallel transducers 98. Finally, the outer ends 104 and 106 of the third set of electrode fingers 108 are in spaced axial alignment with corresponding ones of the first set of electrode fingers 96 and 100 in both the first and second spaced parallel transducers 98 and 102. This arrangement causes only asymmetric vibration acoustic wave modes to be coupled from the first transducer 98 to the second transducer 102.

Figure 7:
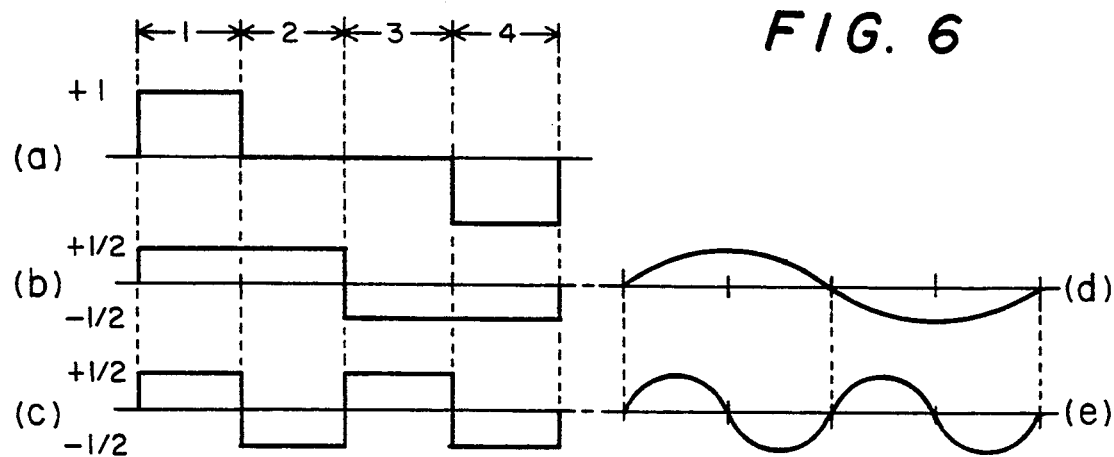
FIG. 7 is a series of waveforms demonstrating that only asymmetric vibration acoustic wave modes are generated in the substrate of the device of FIG. 6.

The corresponding waveforms explaining the operation of the asymmetric device in FIG. 6 is illustrated in FIG. 7. Again, the applied voltage shown in FIG. 7 is related to the wave guides or tracks 1, 2, 3 and 4 illustrated in FIG. 6. As can be seen in FIG. 7(a), when a voltage of one unit is applied to the first transducer 98 or track 1 and the same voltage is applied in opposite polarity of the same magnitude to track 4 or transducer 102, the equivalent voltages across the device are shown in FIGS. 7(b) and 7(c). Note that the voltage in 7(b) is an asymmetric wave and that the voltage shown in FIG. 7(c) is also an asymmetric wave. The resultant generated acoustic wave shown in FIG. 7(d) is an asymmetric acoustic wave. Likewise, the signal shown in FIG. 7(e) is the second asymmetric acoustic wave that is generated by the device. Thus both the waves in FIGS. 7(d) and 7(e) are asymmetrical. No symmetric acoustic waves are generated in this device as can be seen.

Referring now to FIG. 3 again, when the asymmetric wave form 42 represented by curve 32 and the asymmetric wave form 46 represented by the curve 36 are the only acoustic waves generated as illustrated in FIGS. 7(d) and (e), the mode separation represented bracket by 3 is substantially four times larger than the bracket 1 which is generated by a prior art device that generates both symmetrical and asymmetrical modes. Thus an even greater mode separation occurs which allows even a greater adjustment to be made to the beamwidth of the device to obtain a given bandwidth for a given frequency. The device allows further increased coupling, further increased Q and further decreased impedance. Thus, the device as shown in FIGS. 4 and enables substantial adjustment of the beamwidth while increasing coupling and Q and decreasing the impedance of the device.

Consider now the parasitic voltages that are developed by the first and second symmetric modes on the ground bus bar with the device illustrated in FIG. 4. In this device, parasitics are developed primarily by the first symmetric mode. If the input voltage applied to electrode 58 in track 1 is positive, then the adjacent outside ground electrode 70 is negative. In track 2, the inside ground electrode 72 is still negative and the adjacent output electrode 82 is positive. Thus as shown in FIG. 8, which is a schematic representation of such connection, the voltage on input electrode 58 is positive. The capacitor 122 represents the natural capacitance existing between the positive input electrode 58 and the outside ground electrode 70, and the resistance 126 represents the inherent resistance in the ground bus bar 76 at high frequencies. Thus, the current flows from the positive terminal 58 through capacitor 122 and resistance 126 to outside ground electrode finger 70. In like manner, the portion 82 of the third set of electrodes 78 will be positive with respect to the adjacent inside ground electrode finger 72. Thus, again, current will flow through the existing capacitance 124 between the electrodes and the resistance 126 formed by the same ground bus bar 76. A voltage is developed across resistance 126 in the ground bus bar 76 which is called a parasitic voltage. This voltage may need to be eliminated or some compensation provided therefor and is usually done in the circuits external to the transducer. An analysis of the second symmetric mode will show that little or no parasitic voltage will be developed by the second symmetric mode in the device.

The device in FIG. 9 will significantly reduce the parasitic voltages developed on the ground bus bar 76 by the first symmetric acoustic wave mode as shown by the equivalent circuit shown in FIG. 10. As can be seen in FIG. 9, the inner end 131 of each of the second electrode sets 138 and 140 of each of said first and second transducers on one side of the common ground bus 132 is in axial alignment with corresponding ones of the first set of electrode fingers 128 and 130 of each of the first and second transducers. The outer end 130 of each of the second set of electrode fingers 138 and 140 of each of the first and second transducers on the other side of the common ground bus 132 are in axial alignment with corresponding ones of the third set of electrode fingers 142 such that only symmetric vibration acoustic wave modes are generated in the substrate by an input signal. Thus in such arrangement, considering only the first symmetric mode, when a positive input signal is applied to electrode 128, the opposed ground electrode 130 is negative. Since the inner portion 131 of the second set of electrodes 140, the ground electrode, is opposite the positive electrode 128, then electrode finger 131 will be positive with respect to the adjacent electrode finger of the third set of electrode fingers 142, the output terminals. The equivalent diagram is illustrated in FIG. 10. When a positive voltage appears at electrode finger 128, current flows through the inherent capacitance 144 between electrodes 128 and 130. Since the ground bus bar 76 has some resistance at high frequencies, the current also flows through resistance 146 to the ground electrode finger 130. However, because electrode finger 131 is in axial alignment with input finger 128, it is positive with respect to its adjacent output electrode finger. Thus current flows from the ground electrode finger 131 as a positive voltage through the equivalent resistance 146 and inherent capacitance 148 to the electrode finger of the third set 142 of output electrode fingers which is negative. Thus it can be seen that the current travels through the inherent resistance 146 in opposite directions, thus substantially cancelling any parasitic voltages that may exist therein by reason of the first symmetric acoustic mode. An analysis of the second symmetric acoustic wave mode will show that parasitic voltages are developed by the second symmetric mode in the device in FIG. 11. Thus, either the device of FIG. 4 or the device of FIG. 9 can be selected depending upon which parasitic voltage is desired to be eliminated.

FIG. 11 is a plan view of a device for substantially reducing parasitic voltage on the ground bus bar caused by the first asymmetric acoustic wave mode. In the device of FIG. 6, a parasitic voltage will be developed by the first asymmetric mode while substantially no parasitic voltage will be developed by the second asymmetric wave mode. The device of FIG. 11 reverses this condition by substantially reducing the parasitic voltage caused by the first asymmetric mode but then a parasitic voltage is developed by the second asymmetric wave mode. In FIG. 11, the first set of transversely extending-electrode fingers 150 of the first transducer are positioned longitudinally on the substrate 180° electrically out-of-phase with the first set of transversely-extending electrode fingers 152 of the second transducer. Further, the first and second outer ends 154 and 156 of the third transducer electrode fingers are alternately positioned longitudinally on the substrate 180° out-of-phase with each other such that the first outer end 154 is 180° out-of-phase electrically with the first set of electrode fingers 150 of the first transducer and in-phase electrically with the first set of electrode fingers 152 of the second transducer. The second outer end 156 of the third transducer electrode fingers is in-phase electrically with the first set of electrode fingers 150 of the first transducer and 180° out-of-phase electrically with the first set of electrode fingers 152 of the second transducer. Finally, the inner ends 156 and 158 of the electrode fingers of each second set of electrode fingers of both of the first and second transducers are interdigitated with the adjacent alternately positioned electrode fingers 154 and 156 of the third set of electrode fingers coupled to the common output signal bus 157 . Again, it will be noted that with a positive voltage applied to electrode 150, a negative voltage will be developed on adjacent electrode 162. This means output electrode 154 will be negative with respect to ground electrode 158. The circuit in FIG. 10 applies in like manner as previously explained and the parasitic voltage on the ground bus bar caused by the first asymmetric acoustic wave mode is substantially cancelled. Thus, either the device of FIG. 6 or the device of FIG. 11 can be used depending upon which parasitic voltage needs to be reduced or cancelled. Again, the device in FIG. 11 generates only asymmetric acoustic wave modes.

FIG. 12 is a partial view of one of the acoustic wave devices illustrating how the bandwidth can be changed by varying the beamwidth of the device. The beamwidth of the first and second transducers is illustrated by the brackets 174 and 176, respectively. By moving the common ground lines 170 and 172 towards or away from their respective input buses 166, the beamwidths 174 and 176 are varied. As can be seen in FIG. 12, when the beamwidths 174 and 176 are made wider, greater coupling occurs between adjacent electrodes. This causes reduced impedance and greater Q of the device. Further, as the beamwidths 174 and 176 of the first and second transducers are wider, the gap 178 between transducers becomes narrower and the bandwidth decreases.

Thus as stated earlier, suppose that the beamwidths 174 and 176 in FIG. 12 are made identical to the prior art devices illustrated in U.S. Pat. No. Re. 33,957 for a given frequency. With the present device, using the symmetric mode device, the bandwidth would be 2.6 times greater than the prior art bandwidth and, using the asymmetric mode device device, the bandwidth of the present device would be four times greater than the bandwidth of the prior art. Thus, for example only, if the bandwidth of the prior art device was 500 kHz, using the asymmetric device of the present invention, the bandwidth would be 2 MHz. By moving the two common ground lines 170 and 172 closer to each other as illustrated in FIG. 12 and increasing the beamwidths 174 and 176 of the first and second transducers, the bandwidth could be reduced from 2 MHz to 500 kHz. At the same time, the coupling would be increased, the Q increased and the impedance decreased, thus forming a much more efficient device than the prior art. Further, by using the embodiments shown in FIGS. 9 and 11, selected parasitic influences could be substantially eliminated.

Further, the overlap of adjacent electrodes 165 and 167 may be adjusted as desired by changing the length of one or both of electrode fingers 165 and 167.

Thus, there has been disclosed a novel surface acoustic wave device for generating an output signal with only a symmetric or only an asymmetric vibration mode acoustic wave. The device has four tracks which are not necessarily the same width and, by changing track width, both mode couplings may be adjusted. The device will work with any type of acoustic wave device that has an electrical potential propagating along the surface. Coupling can also be changed by varying the overlap of the fingers. Thus the overlap may be increased or decreased to change coupling. The present device has a wider bandwidth for a given frequency than prior art devices and, for a given beamwidth, the output pole separation is much further apart. Thus, by increasing the track or beamwidth to get better coupling, the same pole separation can be maintained with a lower impedance. The device is easier to match to a given load.

Also, the present device, in either the symmetric or asymmetric mode, can substantially eliminate parasitic losses. The device can be used for resonators, bandpass filters and the like. It can be formed on quartz or other piezoelectric material. The reflectors on either end of the transducers may be formed of grooves or metal deposits.

While the invention has been described in connection with a preferred embodiment, it is not intended to limit the scope of the invention to the particular form set forth, but, on the contrary, it is intended to cover such alternatives, modifications, and equivalents as may be included within the spirit and scope of the invention as defined by the appended claims.

I claim:

1. An acoustic wave device for generating an output signal with only a symmetric vibration acoustic wave mode, the device comprising:

a piezoelectric substrate having a longitudinal axis;

first and second transversely spaced surface acoustic wave transducers on the substrate, one on each side of the longitudinal axis of the substrate, each transducer being formed of a first set and a second set of electrode fingers interdigitated with each other and extending transversely to the longitudinal axis of the substrate, each electrode finger having an outer end and an inner end;

a common input signal bus connected to the outer ends of the first set of electrode fingers of both of the transversely spaced transducers;

the first set of electrode fingers of the first one of the spaced parallel transducers being in spaced axial alignment with corresponding ones of the first set of electrode fingers of the second one of the spaced parallel transducers;

the second set of electrode fingers of the first one of the spaced parallel transducers being in spaced axial alignment with corresponding ones of the second set of electrode fingers in the second one of the spaced parallel transducers;

a third set of electrode fingers having first and second outer ends, each outer end being interdigitated with, and electrically isolated from, its adjacent second set of electrode fingers of each of said first and second spaced transducers to form a third transducer;

a set of reflector elements deposited on the substrate as electrode fingers in spaced relationship with each end of each of said first, second, and third transducers;

a common ground bus interconnecting the reflector electrode fingers with each electrode finger of the second set of electrode fingers of both the first and second transducers, the ground bus interconnection occurring between the inner and outer ends of each electrode finger of the second set of electrode fingers; and a common output signal bus interconnecting the third set of electrode fingers between the first and second outer ends thereof such that an input signal applied to the input bus causes only a symmetric vibration acoustic wave mode in the substrate to generate an output signal.

2. An acoustic wave device for generating an output signal with only an asymmetric vibration acoustic wave mode, the device comprising:

a piezoelectric substrate having a longitudinal axis;

first and second transversely spaced surface acoustic wave transducers on the substrate, one on each side of the longitudinal axis of the substrate, each transducer being formed of a first set and a second set of electrode fingers interdigitated with each other and extending transversely to the longitudinal axis of the substrate, each electrode finger having an outer end and an inner end;

the first set of electrode fingers in the first one of the spaced parallel transducers being in spaced axial alignment with corresponding ones of the second set of electrode fingers of the second one of the spaced parallel transducers;

the first set of electrode fingers in the second one of the spaced parallel transducers being in spaced axial alignment with corresponding ones of the second set of electrode fingers of the first one of the spaced parallel transducers;

a third set of electrode fingers having first and second outer ends, each outer end being interdigitated with, and electrically isolated from, its adjacent second set of electrode fingers of each of the first and second spaced transducers to form a third transducer;

a common input signal bus connected to the outer ends of the first set of electrode fingers of both of the transversely spaced transducers;

the outer ends of the third set of electrode fingers being in spaced axial alignment with corresponding ones of the first set of electrode fingers in both the first and second spaced parallel transducers such that only asymmetric vibration acoustic wave modes are generated in the substrate by a input signal applied to the input bus;

a set of reflector elements deposited on the substrate as electrode fingers in spaced relationship with each end of each of said first, second, and third transducers; and a common ground bus interconnecting the reflector electrode fingers and each electrode finger of the second set of electrode fingers of both the first and second transducers, the ground bus interconnection occurring between the inner and outer ends of each electrode finger of the second set of electrode fingers.

3. An acoustic wave device for generating an output signal with only symmetric vibration acoustic wave modes, the device comprising:

a piezoelectric substrate having a longitudinal axis;

first and second transversely spaced surface acoustic wave transducers on the substrate, one on each side of the longitudinal axis of the substrate, each transducer being formed of a first set and a second set of electrode fingers interdigitated with each other and extending transversely to the longitudinal axis of the substrate, each electrode finger having an outer end and an inner end;

the inner end of each of said second set of electrode fingers of each of said first and second transducers being in axial alignment with corresponding ones of the first set of electrode fingers of each of said first and second transducers;

a common input signal bus connected to the outer ends of the first set of electrode fingers of both of the transversely spaced transducers;

a common ground bus interconnecting each electrode finger of the second set of electrode fingers of both the first and second transducers, the ground bus interconnection occurring between the inner and the outer ends of each electrode finger of the second set of electrode fingers;

a third set of electrode fingers having first and second outer ends, each outer end being interdigitated with, and electrically isolated from, its adjacent second set of electrode fingers of each of said first and second spaced transducers to form a third transducer;

a set of reflector elements deposited on the substrate as electrode fingers in spaced relationship with each end of the first, second, and third transducers;

said common ground bus interconnecting the reflector electrode fingers with the second set of electrode fingers of both the first and second transducers;

the outer end of each of said second set of electrode fingers of each of said first and second transducers being in axial alignment with corresponding ones of the third set of electrode fingers such that only symmetric vibration acoustic wave modes are generated in the substrate by an input signal; and any parasitic voltages generated by the symmetric mode on the common ground bus with the first and second sets of electrode fingers of the first and second transducers substantially cancel any parasitic voltage generated on the common ground bus with the second set of electrode fingers of the first and second transducers and the third set of electrode fingers.

4. An acoustic wave device for generating an output signal with only asymmetric vibration acoustic wave modes, the device comprising:

a piezoelectric substrate having a longitudinal axis;

first and second transversely spaced surface acoustic wave transducers on the substrate, one on each side of the longitudinal axis of the substrate, each transducer being formed of a first set and a second set of electrode fingers interdigitated with each other and extending transversely to the longitudinal axis of the substrate, each electrode finger having an outer end and an inner end;

the first set of transversely extending electrode fingers of the first transducer being positioned longitudinally on the substrate 180° electrically out-of-phase with the first set of transversely extending electrode fingers of the second transducer;

a common input signal bus connected to the outer ends of the first set of electrode fingers of both of the transversely spaced transducers;

the outer end of the electrode fingers of each second set of electrode fingers of both of the first and second transducers being interdigitated with the adjacent alternately positioned electrode fingers of the first set of electrode fingers of the first and second transducers;

the inner end of the electrode fingers of each second set of electrode fingers of each of the first and second transducers being in axial alignment with the first set of electrode fingers of its associated first or second transducer and interdigitated with the adjacent electrode fingers of the third transducer;

a third set of electrode fingers having first and second outer ends, each outer end being interdigitated with, and electrically isolated from, its adjacent second set of electrode fingers of each of said first and second spaced transducers to form a third transducer;

reflector elements deposited on the substrate as electrode fingers in spaced relationship with each end of said first, second, and third transducers;

the common ground bus interconnecting the reflector electrode fingers with each electrode finger of the second set of electrode fingers of both the first and second transducers;

the first and second outer ends of the third set of electrode fingers being alternately positioned longitudinally on the substrate 180° electrically out-of-phase with each other such that the first outer end is 180° out-of-phase electrically with the first set of electrode fingers on the first transducer and in-phase electrically with the first set of electrode fingers of the second transducer and the second outer end is inphase electrically with the first set of electrode fingers of the first transducer and 180° out-of-phase electrically with the first set of electrode fingers of the second transducer; and a common output signal bus interconnecting the third set of electrode fingers between the first and second outer ends thereof such that an input signal applied to the input bus causes only an asymmetric vibration acoustic wave mode in the substrate to generate an output signal.

5. A device as in claim 1 wherein the reflectors are spaced grooves in the substrate.

6. A device as in claim 1 wherein for a given electrode finger length, the overlap of the input electrode fingers and the adjacent ground electrode fingers determines the beamwidth of the first and second transducers.

* * * * *